(12) United States Patent
Tanie et al.

(10) Patent No.: US 7,573,128 B2
(45) Date of Patent: Aug. 11, 2009

(54) SEMICONDUCTOR MODULE IN WHICH A SEMICONDUCTOR PACKAGE IS BONDED ON A MOUNT SUBSTRATE

(75) Inventors: Hisashi Tanie, Tsuchiura (JP); Nae Hisano, Matsudo (JP); Koji Hosokawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/836,098

(22) Filed: Apr. 29, 2004

(65) Prior Publication Data

US 2005/0001302 A1 Jan. 6, 2005

(30) Foreign Application Priority Data

May 6, 2003 (JP) .............................. 2003-127640

(51) Int. Cl.
*H01L 23/02* (2006.01)
(52) U.S. Cl. ............... 257/686; 257/777; 257/E25.006; 257/E25.013
(58) Field of Classification Search ................. 257/686, 257/690, 738, 777, 779, 780, E25.006, E25.013
See application file for complete search history.

(56) References Cited

U.S. PATENT DOCUMENTS 6,025,648 A * 2/2000 Takahashi et al. ........... 257/778
6,583,503 B2 * 6/2003 Akram et al. ............... 257/686
2003/0052399 A1 * 3/2003 Shibata ....................... 257/686

FOREIGN PATENT DOCUMENTS

| JP | 08-236694 | 9/1996 |
|----|-----------|--------|
| JP | 2000-286380 | 10/2000 |
| JP | 2002-176135 | 6/2002 |

* cited by examiner

*Primary Examiner*—Hoai v Pham
(74) *Attorney, Agent, or Firm*—Townsend and Townsend and Crew LLP (57) ABSTRACT

A semiconductor module comprises: semiconductor packages each comprising a semiconductor element, a wiring substrate having a wiring member connected to the semiconductor element and external terminals connected to the wiring member, and a first organic film formed on a side of the semiconductor element opposed to a side toward the wiring substrate; and a mount substrate, on which the semiconductor element is mounted. First of the semiconductor packages and second of the semiconductor packages are stacked. Second organic films are provided between the wiring substrate of the first semiconductor package and the first organic film of the second semiconductor package and between the mount substrate and the semiconductor package.

6 Claims, 9 Drawing Sheets

SEMICONDUCTOR MODULE IN WHICH A SEMICONDUCTOR PACKAGE IS BONDED ON A MOUNT SUBSTRATE

BACKGROUND OF THE INVENTION

The present invention relates to a semiconductor module.

Semiconductor memories are used in various information-processing equipment such as large computers, personal computers, portable equipment, etc. and have been yearly increased in necessary capacity. In keeping with an increase in capacity, semiconductor memories are increased in mount area, which constitutes a factor that hinders miniaturization of the equipment. Hereupon, techniques have been developed for high-density mounting of semiconductor memories. As a technique for mounting many packages on a mount substrate having a limited area, techniques, in which a plurality of packages are stacked and mounted on a mount substrate, have been developed. Constructions, in which semiconductor modules are stacked with paste therebetween, are disclosed in JP-A-2002-176135, JP-A-8-236694, and JP-A-2000-286380.

In the case where a high-density mounted module is to be formed, however, semiconductor modules are reduced in outer dimension, or mounted in high-density. Therefore, when semiconductor packages are mounted on a mount substrate, or on other semiconductor packages, modules are preferably formed to be thin as a whole. In the case where packages are thin, however, they are small in flexural rigidity, so that warp is generated at the time of package assembling and there is a need of restricting generation of disadvantages in subsequent mount processes and at the time of inspection.

Also, it is desired that a mounted package with a semiconductor element mounted thereon be constructed to be excellent in ability of heat radiation while ensuring reliability in a mounted portion. The invention solves at least one of these problems.

BRIEF SUMMARY OF THE INVENTION

The invention of the present application can have, for example, the following configurations.

A semiconductor module is configured such that a plurality of semiconductor packages are stacked on one another with organic films therebetween. Concretely, a semiconductor module comprises: semiconductor packages each comprising a semiconductor element, a wiring substrate having a wiring member connected to the semiconductor element and external terminals connected to the wiring member, and a first organic film formed on a side of the semiconductor element opposed to a side toward the wiring substrate; and a mount substrate, on which the semiconductor element is mounted; wherein first of the semiconductor packages and second of the semiconductor packages are stacked, and wherein second organic films are provided between the wiring substrate of the first semiconductor package and the first organic film of the second semiconductor package and between the mount substrate and the semiconductor package.

With the above construction, the semiconductor module is characterized in that the semiconductor element is mounted on the wiring substrate of the semiconductor package on the same side as that, on which a connection member to be connected to the external terminals is mounted.

Alternatively, a semiconductor module comprises: semiconductor packages each comprising a semiconductor element, and a wiring substrate having a wiring member connected to the semiconductor element and external terminals connected to the wiring member; and a mount substrate, on which the semiconductor elements are mounted; wherein first of the semiconductor packages and second of the semiconductor packages are stacked, and wherein a first organic film and a second organic film are provided between the wiring substrate of the first semiconductor package and the semiconductor element of the second semiconductor package.

In addition, it is preferable that the wiring substrate comprises two or more wiring layers.

In addition, the first organic film is formed at the time of formation of the semiconductor packages and the second organic film is formed at the time of formation of the module. Concretely, the following steps are comprised: a semiconductor package forming step comprising forming a wiring substrate having a wiring member and external terminals connected to the wiring member on a principal surface of a semiconductor element and a first organic film on a side opposed to the principal surface to form a semiconductor package; and a mounting step of mounting a first semiconductor package on a mount substrate and mounting a second semiconductor package on the wiring substrate of the first semiconductor package; said mounting step including a step of forming second organic films between the wiring substrate of the first semiconductor package and the first organic film of the second semiconductor package and between the mount substrate and the semiconductor package.

Reduction of warp in a package itself prior to mounting is restricted by arranging a member, which has an appropriate physical property and a thickness, on a back surface of a semiconductor element of the package. Further, preventing cracking of a semiconductor element for a thermal load after mounting and ensuring the life-time of solder joints are obtained by joining a member, which is arranged on a back surface of a semiconductor element, to a mount substrate close thereto to decrease bending deformation of the semiconductor element. Further, by bonding the back surface of the semiconductor element to the mount substrate, the ability of heat radiation is improved and element temperature in operation falls.

In this manner, the invention provides a construction, in which mounting is carried out particularly while warp, etc. of a semiconductor package is restricted, so that it is possible to effectively restrict portions, in which stress concentration is generated, in the module.

Therefore, it is possible to restrict generation of warp at the time of package assembling and generation of disadvantages in a subsequent mounting process and at the time of inspection, and it is possible to provide a module having an excellent ability of heat radiation while ensuring reliability in a mounted portion of a mounted package, on which a semiconductor element is mounted.

Further, when a thermal load in temperature cycle tests is imposed on a module after mounting, there is a fear that a semiconductor element undergoes bending deformation due to a difference in coefficient of linear expansion between a semiconductor element and a mount substrate to cause cracking of the semiconductor element. According to the invention, reduction of warp in a package itself prior to mounting and restriction of cracking of a semiconductor element for a thermal load after mounting can be achieved by a construction, in which semiconductor packages each having an organic layer provided on a back surface side of a semiconductor element are stacked and a construction, in which a member connected to a substrate of a package adjacent to the organic layer between adjacent packages is arranged.

Also, solder joints in a high-density mounted module accommodate deformation caused due to a difference in coefficient of linear expansion between a semiconductor element and a mount substrate, so that a highly reliable module contributable to ensuring of the life-time of solder can be constructed even when the life-time of solder joints is made severe for a thermal load.

Further, since even a high-density mounted module enables achieving an improvement in ability of heat radiation of the module and reduction in element temperature in operation, it is possible to suppress malfunction and degraded performance of a semiconductor element due to a rise in element temperature in operation.

Other objects, features and advantages of the invention will be made apparent from descriptions of embodiments of the invention taken with reference to the accompanying drawings.

DETAILED DESCRIPTION OF THE INVENTION

Embodiments of the invention will be described hereinafter.

Figure 1A:
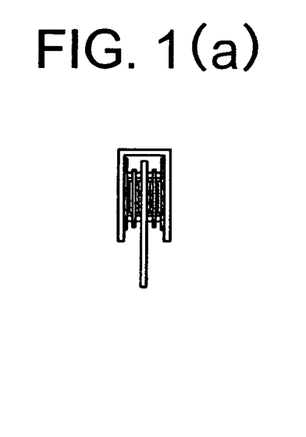
FIG. 1 is views illustrating a first embodiment of a semiconductor module according to the invention.
Figure 1B:
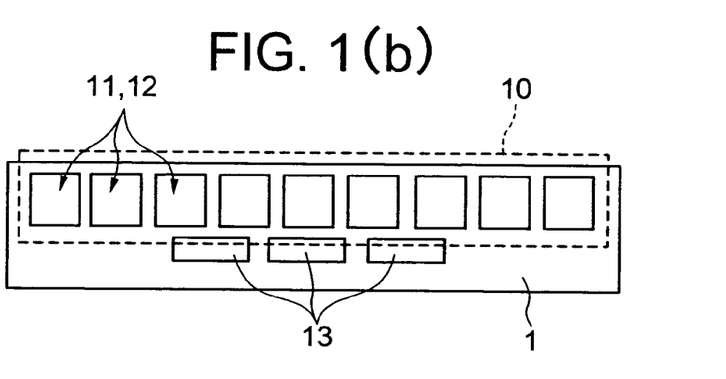
Figure 1C:
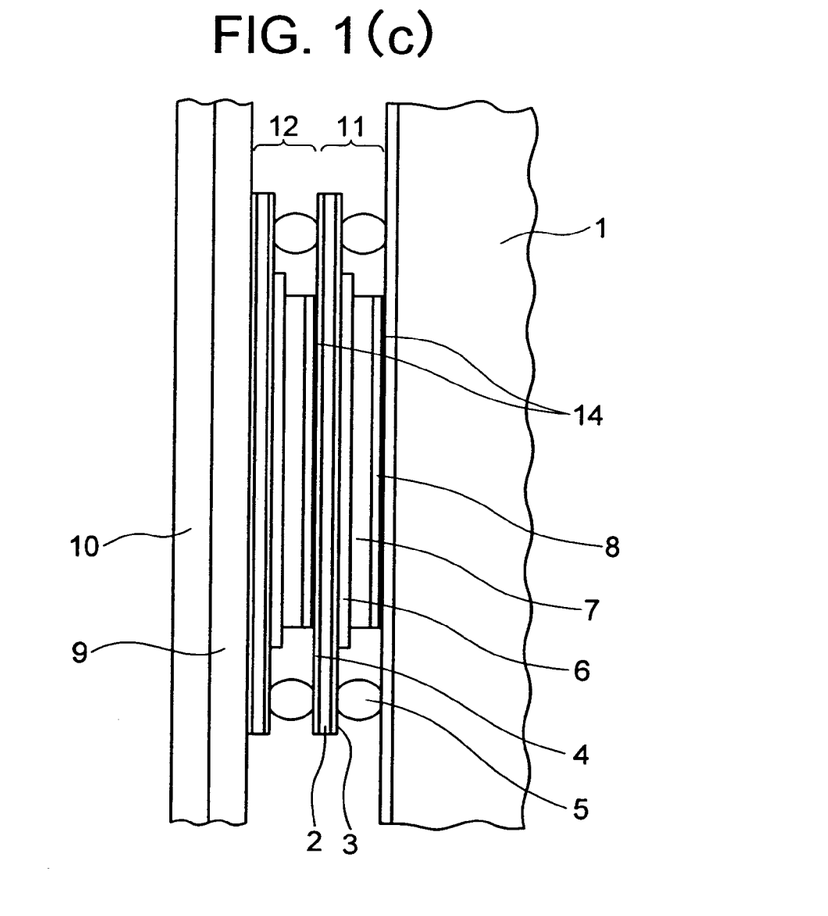

FIG. 1 is views illustrating a first embodiment of a semiconductor module according to the invention, in which FIG. 1(a) is a side view showing the semiconductor module, FIG. 1(b) is a plan view showing the semiconductor module, and FIG. 1(c) is a view showing, in an enlarged scale, a neighborhood of packages of the semiconductor module in the side view.

In the present embodiment, a lower-stage package 11 is mounted on one side of a mount substrate 1 being a glass epoxy substrate, and an upper-stage package 12 is mounted on an outside of the lower-stage package 11. Also, although not shown in the drawings, a lower-stage package 11 and an upper-stage package 12 can be likewise arranged on an opposite side of the mount substrate 1. That is, a construction is possible, in which four packages are stacked and mounted in a thicknesswise direction of the mount substrate. As shown in FIG. 1(b), a plurality of packages including the packages 11, 12 are arranged in parallel on the mount substrate 1, and on-board parts 13 other than the semiconductor packages 11, 12 are mounted on the mount substrate 1 to thereby realize a high-density stacked mounting. The upper-stage package 12 is preferably connected to a radiation plate 10 via a heat conduction member 9. Here, the radiation plate 10 is made of a Cu alloy having a high thermal conductivity. While SUS, etc. can be used to form the radiation plate 10, it is low in thermal conductivity as compared with Cu, and so the module is increased in heat resistance as compared with the case where Cu is used. An elastic body having a low modulus of longitudinal elasticity is used to form the heat conduction member 9 whereby clearances between it and the radiation plate 10 and between it and the upper-stage package 12 are decreased to improve conduction of heat and an external force exerted on the radiation plate 10 is prevented from being transmitted to the upper-stage package 12.

The lower-stage package 11 and the upper-stage package 12 can be made the same in structure. The structure is as follows. A wiring substrate provided with a tape-shaped wiring member that comprises an insulator 2 having a thickness of the order of 40 µm and made of polyimide and wiring layers 3, 4 having a thickness of the order of 20 µm and made of Cu, and a semiconductor element 7 are joined together through a binder member 6 having a thickness of the order of 50 µm and made of elastomer. The semiconductor element uses a DRAM of 512 MB and has a plane dimension of about 10 m for each side and a thickness of about 150 µm.

In this manner, a module mounting thereon thin large-sized semiconductor elements that have a long side of 60 times or more a thickness of the element is preferable from a viewpoint of obtaining an actual effect of the invention.

Two metallic wiring layers are provided on the wiring member to match the characteristic impedance and to reduce electric noise, thereby affording signal transmission at high speed. The semiconductor element 7 is smaller in plane dimension and area than the wiring member that comprises the insulator 2 and the wiring layers 3, 4, and the binder member 6, and a circuit surface of the semiconductor element 7 is arranged in a direction facing the binder member 6. The wiring member comprising the insulator 2 and the wiring layers 3, 4 comprises external terminals in the vicinity of those ends thereof, which are outside the semiconductor element 7 and to which the binder member 6 is not joined, and solder balls 5 having a diameter of about 300 µm are arranged on the external terminals. With the semiconductor module constructed in the above manner, back-surface members 8 having a thickness of about 100 µm are arranged on back surfaces of the semiconductor elements 7 of the respective semiconductor packages 11, 12, that is, sides opposed to the respective wiring substrates. Here, there is shown an example, in which the solder balls 5 and the back-surface members 8 are used to join the mount substrate 1 and the lower-stage package 11 together and the lower-stage package 11 and the upper-stage package 12 together. Here, the solder balls 5 are connected to the wiring layers 3, 4, and electric conduction between the mount substrate 1 and the semiconductor packages 11, 12 is achieved via the solder balls 5. While the back-surface members 8 are mechanically connected to the mount substrate 1, it is possible to provide no electric conduction therebetween. Further, the solder balls 5 have a larger length in a direction of mounting than a thickness of the semiconductor element 7.

According to the embodiment, the solder balls 5 and bonding layers 14 formed on the back-surface members 8 of the packages join the lower-stage package 11 and the mount substrate 1 together, and the lower-stage package 11 and the upper-stage package 12 together. The back-surface members 8 and the bonding layers are made of, for example, an organic film such as an epoxy base resin.

Such construction can provide a highly reliable semiconductor module having a great effect in extending the life-time of solder and preventing crack failure of the semiconductor elements 7 for a thermal load in temperature cycle tests as compared with the case where joining is achieved only by means of the solder balls 5. Further, since temperature rise of the semiconductor elements 7 due to heat generated from the semiconductor elements 7 can be decreased, it is possible to provide a semiconductor module, which prevents failure and malfunction, or degraded performance of semiconductor elements due to temperature rise and which is also highly reliable in thermal aspect.

A mechanism, in which by joining the lower-stage package 11 and the mount substrate 1 together and the lower-stage package 11 and the upper-stage package 12 together through the solder balls 5 and the bonding layers 14 formed on the back-surface members 8, the life-time of solder is extended at the time of application of a thermal load as compared with the case where joining is achieved only by means of the solder balls 5, will be described hereinafter. FIG. 2 is views illustrating the deformation analysis of the semiconductor module when temperature falls.

Figures 2A, 2B:
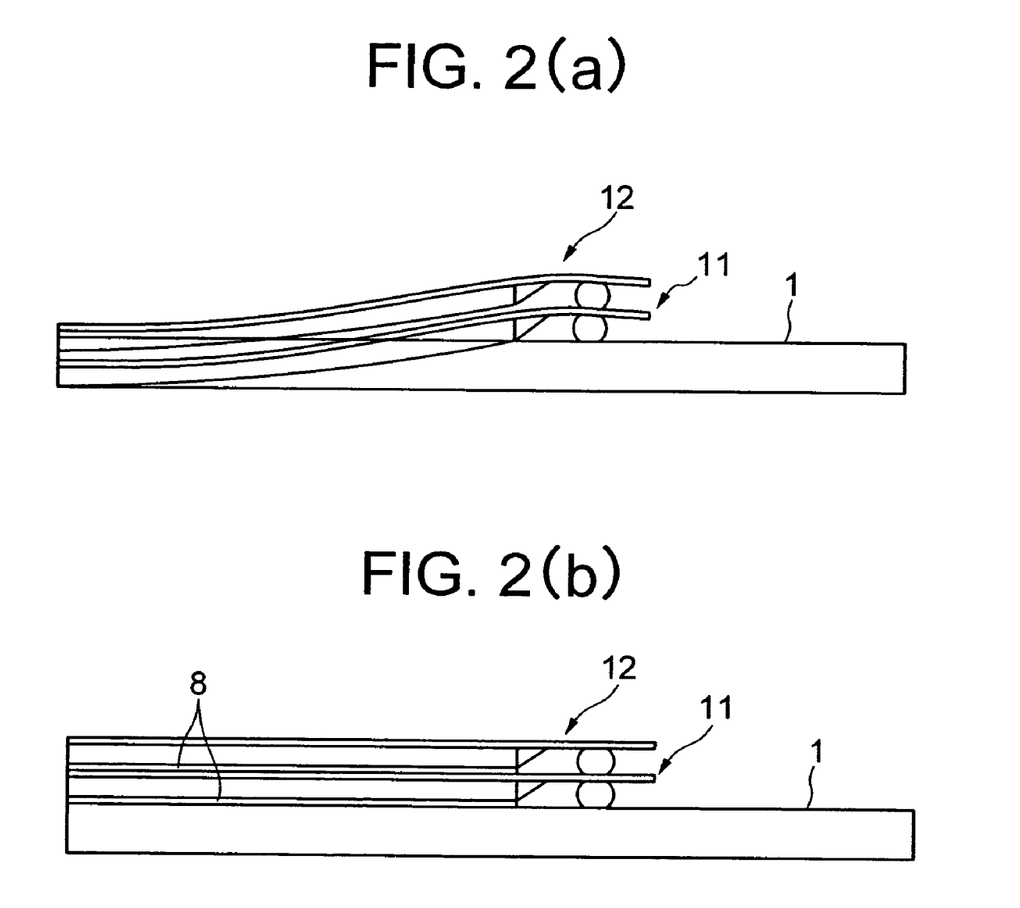
FIG. 2 is views illustrating deformation of a semiconductor module to explain an effect of the invention.

FIG. 2(a) shows a condition that the semiconductor packages and the mount substrate are joined together only by means of the solder balls, and FIG. 2(b) shows a condition that the semiconductor packages and the mount substrate are joined together by means of the solder balls and the back-surface members. What is analyzed is ¼ models of the entirety, for which symmetry in shape is taken account of, and deformation is shown in an enlarged scale. In addition, the semiconductor elements 7 and the mount substrate 1 overlap mutually in FIG. 2(a) because deformation is illustrated in an enlarged scale, and the semiconductor elements 7 and the mount substrate 1 do not overlap mutually in fact. Under the condition shown in FIG. 2(a) that joining is achieved only by means of the solder balls, bending deformation is resulted in the semiconductor elements 7. This is because the mount substrate 1 is larger in coefficient of linear expansion than the semiconductor elements 7 and so bending deformation of the semiconductor elements 7 accommodates a difference therebetween in thermal deformation generated when temperature falls. In the case where a plurality of semiconductor packages are stacked on a mount substrate as in the embodiment, there is a need of thinning the semiconductor packages. The thinner the semiconductor packages, the smaller the flexural rigidity thereof to make bending deformation thereof easy.

When the semiconductor elements 7 undergo bending deformation in a downwardly convex configuration as shown in FIG. 2(a), a large plastic strain is generated in the solder balls 5, by which the semiconductor package 11 undergoing bending deformation and the mount substrate 1 undergoing little bending deformation are joined together. It is known that the life-time of solder due to low cycle fatigue is governed by a value of a range of plastic strain every temperature cycle, and the larger the range of plastic strain is, the shorter the life-time is. Accordingly, bending deformation of the semiconductor elements 7 generates a large range of plastic strain in the solder balls whereby the life-time of solder is shortened. Further, in the case where the semiconductor elements 7 undergo bending deformation in a downwardly convex configuration as shown in FIG. 2(a), tensile stresses are set up on back surfaces (lower surfaces in the drawing) of the semiconductor elements and compressive stresses are set up on circuit surfaces (upper surfaces in the drawing) of the semiconductor elements. When bending deformation of the semiconductor elements is large and tensile stresses set up on the back surfaces of the semiconductor elements are equal to or larger than the transverse rupture strength of a material forming the back surfaces, the semiconductor elements crack.

This phenomenon is remarkable in a construction, in which the semiconductor elements 7 are mounted on the mount substrate on a side, to which external terminals are connected. This becomes more remarkable in a thin module, on which the semiconductor elements 7 are stacked.

On the other hand, under the condition shown in FIG. 2(b) that joining is achieved by means of the solder balls and the back-surface members, the back surface of the semiconductor element is joined to the mount substrate by the back-surface member, so that it is possible to restrict bending deformation of the semiconductor elements. Accordingly, any large tensile stresses are not set up on the back surfaces of the semiconductor elements and it is possible to prevent the semiconductor elements from cracking. Further, the range of plastic strain generated in the solder balls due to bending deformation of the semiconductor elements is decreased, so that the life-time of solder is extended. In the case where bending deformation of the semiconductor elements is restricted as in the present embodiment, that difference in thermal deformation between the semiconductor elements and the mount substrate, which is caused due to a difference in coefficient of linear expansion therebetween, is mainly accommodated by shear deformation of the binder members 6 and compressive deformation of the insulators 2. In the embodiment, the binder members 6 are made of elastomer and the insulators 2 are made of polyimide. These materials have elastic modulus as small as ⅒ or less as compared with the semiconductor elements 7 and the solder balls, and these members undergo deformation whereby thermal stresses applied on the solder balls are decreased. Owing to the above effect, the semiconductor package and the mount substrate are joined together by the use of the solder balls and the back-surface member to bring about the effect of extending the life-time of solder and preventing cracking of chips.

In addition, while it is preferable in the embodiment to use the insulators 2 made of polyimide and copper wire for the wiring members, it is also possible to make use of a glass epoxy substrate and a build-up substrate. While the glass epoxy substrate and the build-up substrate are materials having large modulus of longitudinal elasticity as compared with polyimide, plastic strain generated in solder joints can be reduced to be equal to or more than that in the case of using a polyimide tape because the wiring members and the mount substrate are substantially equal to each other in coefficient of linear expansion. In the case where a glass epoxy substrate is used to form the wiring members, however, a semiconductor module becomes thick as compared with that in the case of using polyimide. Further, since the glass epoxy substrate is larger in stiffness than a polyimide tape, a material having a large modulus of longitudinal elasticity and a large coefficient of linear expansion as compared with that in the case of using a polyimide tape must be used to form the back-surface members that are arranged on back surfaces of the semiconductor elements with a view of reducing warp.

Further, according to the embodiment, the back-surface member 8 of the semiconductor element 7 is arranged on the entire back surface of the semiconductor element 7 and is also joined wholly to the mount substrate 1. However, the above effect suffices to reside in that bending deformation of the semiconductor elements 7 be restricted by mechanically joining the semiconductor elements 7 and the mount substrate together. Hereupon, the effect in extending the life-time of solder and preventing crack of the semiconductor elements is demonstrated even when back-surface members 8 of semiconductor elements are arranged only on portions that include a neighborhood of corners on the back surfaces of the semiconductor elements 7. However, restraint on bending deformation of corners of semiconductor elements is weak, a resulting effect will be decreased.

Subsequently, an improvement in ability of heat radiation will be described. Heat generated from semiconductor elements is released to the air mainly from surfaces of the mount substrate and the radiation plate. At this time, in the case where mounting of semiconductor packages is achieved only by the use of solder balls, it is required that heat be transferred to the mount substrate and the radiation plate through conduction and radiation in the air, or transferred thereto via wiring members and solder balls, but the both are poor in heat transfer as compared with the case where heat is directly conducted in a solid body, so that a semiconductor module is increased in heat resistance. On the other hand, in the case where joining of a semiconductor package is achieved by the use of solder balls and a back-surface member, heat generated from semiconductor element is transferred to a mount substrate and a radiation plate via the back-surface member. In this case, heat is directly conducted in a solid body having a large thermal conductivity as compared with that of an air, so that a semiconductor module is decreased in heat resistance. Accordingly, although a semiconductor element is the same in calorific value, it is decreased in temperature rise, so that it is possible to prevent failure, malfunction, and degraded performance of the semiconductor element. This makes it possible to use a semiconductor element having a large calorific value. In addition, even when the back-surface members 8 are arranged not wholly but partly on the back surfaces of the semiconductor elements 7, the module is decreased in heat resistance as compared with the case where the back-surface members 8 are not provided. However, the effect thus produced becomes smaller than that in the case where the back-surface members 8 are arranged wholly on the back surfaces of the semiconductor elements.

Subsequently, a warp reduction effect produced in a package itself will be described. Warp of a package is generated mainly due to a difference in coefficient of linear expansion between the semiconductor element 7 and the insulator 2, the wiring layers 3, 4, and the binder member 6, and when a package itself involves a large warp deformation, there is a fear that a disadvantage is caused at the time of mounting and at the time of package inspection. Such warp of a semiconductor package itself can be reduced by arranging the back-surface member 8 on the back surface of the semiconductor element.

Figure 3:
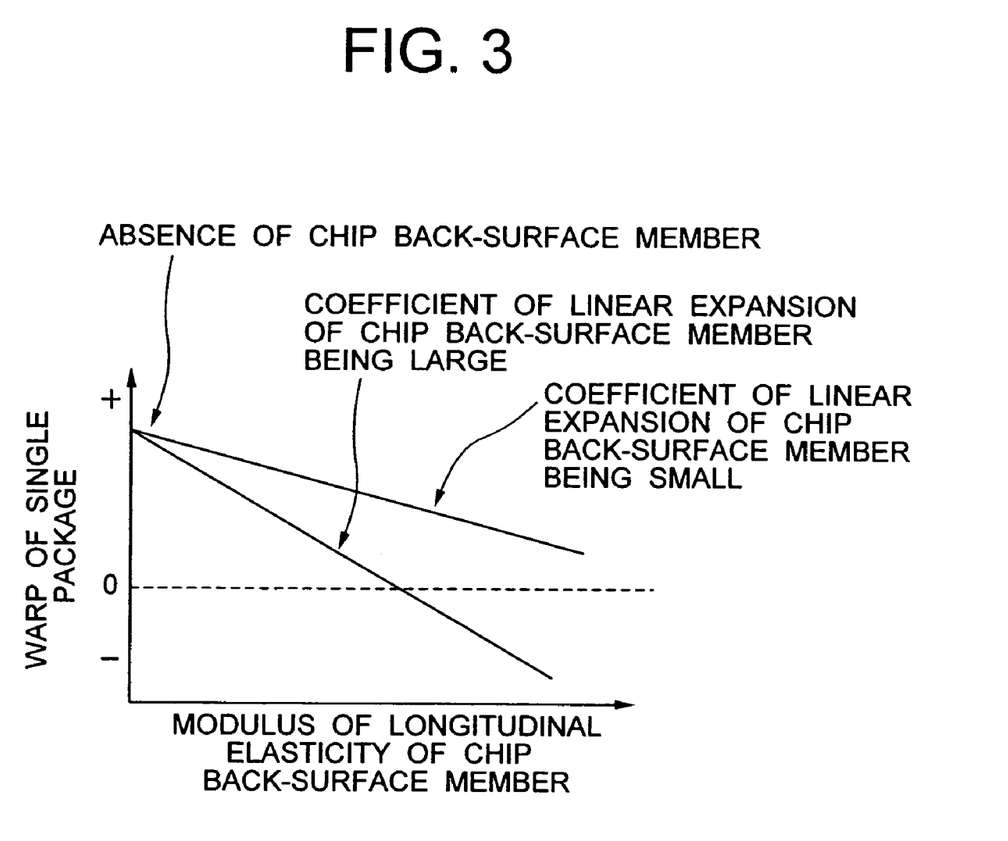
FIG. 3 is a view schematically illustrating an effect of the invention.

FIG. 3 schematically shows influences, which a back-surface member has on warp of a semiconductor package. When any back-surface member is not provided, the semiconductor package undergoes warp deformation that makes a chip back-surface convex. This is because temperatures, at which respective members are joined, are higher than room temperature and those differences in thermal deformation between respective members, which are caused by subsequent temperature drop, appear as warp. Here, warp deformation making a chip back surface convex is denoted by positive and warp deformation making a chip back surface concave is denoted by negative. Accordingly, a positive warp deformation is generated at room temperature when any back-surface member is not provided. When a back-surface member is arranged on the chip back surface, a semiconductor package undergoes less warp. This is because a positive warp deformation caused by the semiconductor element, the insulator 2, and the wiring layers 3, 4 and a negative warp deformation caused by the semiconductor element and the back-surface member cancel each other. Here, the larger the modulus of longitudinal elasticity of the back-surface member is, the smaller the warp of the package becomes, and the warp becomes zero. When the back-surface member is further made large in modulus of longitudinal elasticity, the package conversely undergoes a negative warp deformation. Further, as the coefficient of linear expansion of the back-surface member is larger, warp becomes zero with the modulus of longitudinal elasticity thereof being smaller. From this, it is seen that warp of the package can be controlled by the coefficient of linear expansion of and the modulus of longitudinal elasticity of the back-surface member. By the way, warp of the package is greatly affected by a thickness of the back-surface member such that as a thickness of the back-surface member increases, warp of the package becomes zero at small values of both the coefficient of linear expansion and the modulus of longitudinal elasticity. Since a thickness of the back-surface member is determined dependently by a thickness of the semiconductor element and a height of the solder balls, however, FIG. 3 illustrates the relationship under a condition that the thickness is constant. Further, there is no need of making warp of a semiconductor package itself zero, and so it suffices to select a back-surface member so that warp is decreased in that range, in which no problem is caused at the time of mounting and at the time of inspection.

Taking account of the above matters, a construction, in which a back-surface member having an appropriate physical property is arranged on a semiconductor back-surface of a semiconductor package and the back-surface member and a mount substrate are joined together, is provided as in the embodiment, whereby the construction becomes highly reliable to cope with such problems as extension of the life-time of solder for a thermal load in temperature cycle tests, prevention of chip cracking, an improvement in ability of heat radiation, and reduction of warp in a package.

In case of stacking and mounting packages comprising, as a warp restraint mechanism, a back-surface member made of an epoxy base resin, etc. as in the embodiment, warp of respective packages is decreased, so that dispersion in clearances between a semiconductor element of one semiconductor package and adjacent packages, or a mount substrate can be restricted and therefore back-surface members can be made uniform in thickness after stacking and mounting. Heat generated due to the operation of a semiconductor element is transferred to the mount substrate and the radiation plate through the back-surface member to be radiated. Therefore, in the case where the back-surface members after mounting involve dispersion in thickness, heat resistance in areas extending from the semiconductor elements to the mount substrate and the radiation plate is decreased in locations, in which the back-surface members are thin, so that temperature falls at the time of heat generation, but temperature at the time of heat generation rises in locations, in which the back-surface members are thick. Therefore, the semiconductor elements are increased in distribution of temperature and have a highest temperature higher than that in the case where the back-surface members are uniform in thickness. Accordingly, reduction of warp of packages as in the embodiment is effective in reducing an increase in highest temperature of the semiconductor elements when the semiconductor module operates.

FIG. 4 is schematic views showing, in cross section, semiconductor packages, according to first, second and third embodiments of the invention, that constitute a semiconductor module. There is shown a configuration, in which a semiconductor element is mounted on the same side of a wiring substrate in a semiconductor package as that, on which connection members (solder members in the drawings) connected to external terminals are mounted. While external terminals of a wiring substrate of a semiconductor package for stacking are arranged on both sides, a semiconductor element is mounted on the same side as that, on which members, such as solder bumps themselves, etc., for connection between a package and a mount substrate, or between a package and a package are mounted.

Figure 4A:
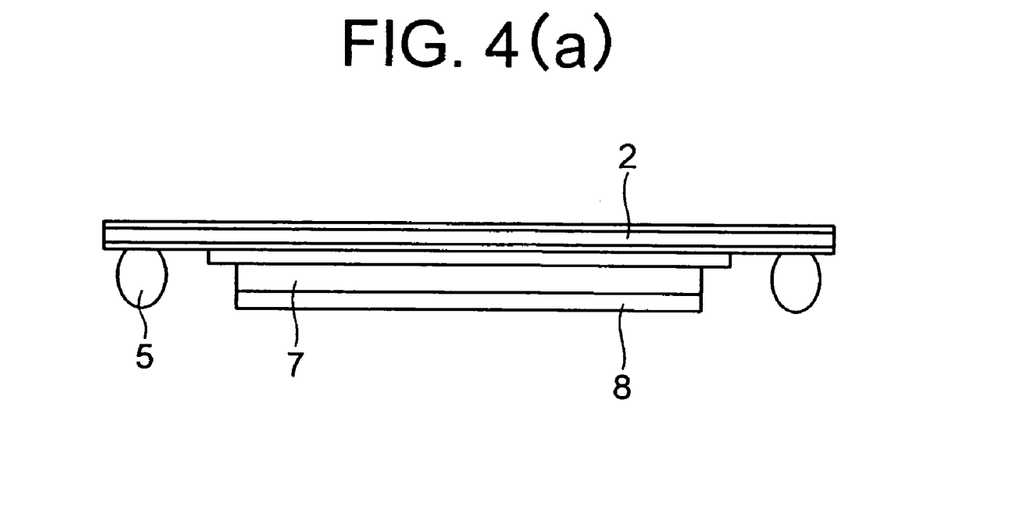
FIG. 4 is views illustrating semiconductor packages used in first, second, and third embodiments of a semiconductor module according to the invention.
Figure 4B:
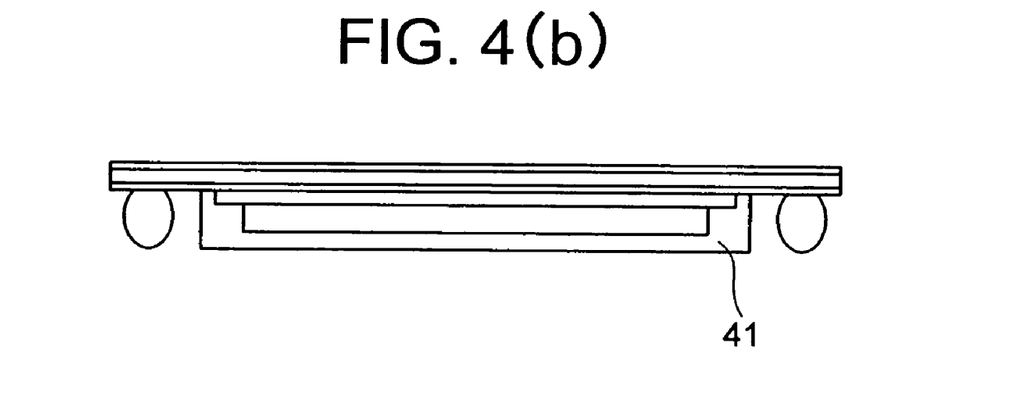
Figure 4C:
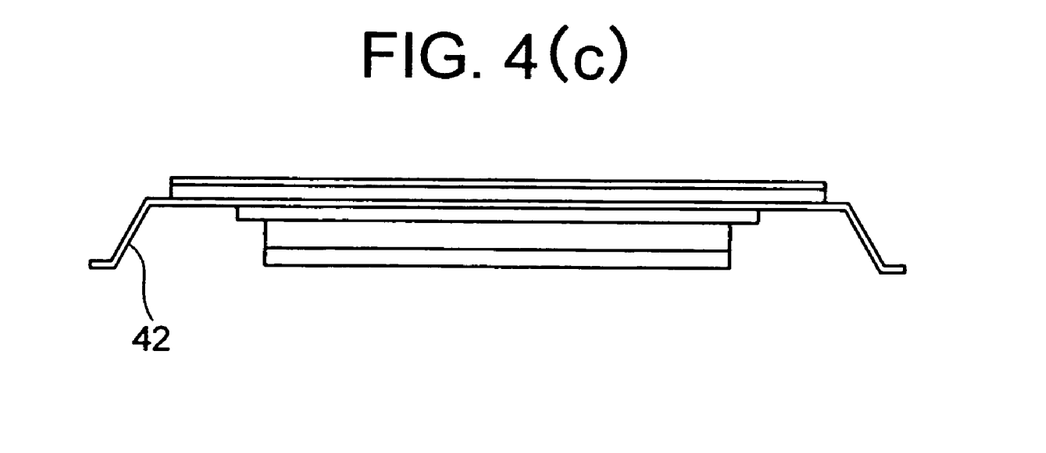

FIG. 4(a) shows a semiconductor package, according to the first embodiment, in which a back-surface member 8 is arranged on a back surface of a semiconductor element 7. FIG. 4(b) is a schematic view showing a cross section of a semiconductor package according to a second embodiment. The semiconductor package according to the second embodiment is of the same construction as that of the semiconductor package according to the first embodiment shown in FIG. 4(a) except the back-surface member 8 of the semiconductor package. The semiconductor package is different from the semiconductor package according to the first embodiment in that the back-surface member 8 is not used but a mold resin 41 is used to mold a back surface and sides of a semiconductor element 7. The effect of the invention such as extension of the life-time of solder, prevention of chip cracking, an improvement in the ability of heat radiation, and reduction of warp in a package itself can also be attained by providing the mold resin 41 on a chip back surface. In this case, however, in order to reduce warp of a package, there is a need of using a mold resin having an appropriate physical property in the same manner as in case of using a back-surface member. FIG. 4(c) is a schematic view showing a cross section of a semiconductor package according to a third embodiment. The semiconductor package is different from the semiconductor package according to the first embodiment in that leads are used as means for electric conduction to a mount substrate. Since thermal stresses set up on solder joints are small in a construction, in which a chip back surface is joined to a mount substrate, it is possible to prevent failure such as a solder joint failure, breakage of leads, etc. in the case where a package and a mount substrate are joined together by means of leads. Further, although not shown in the drawing, it is of course possible to use the sealing resin 41 in place of the back-surface member 8 as illustrated in the second embodiment and to use leads for electric conduction between a package and a mount substrate as illustrated in the third embodiment.

Figure 5:
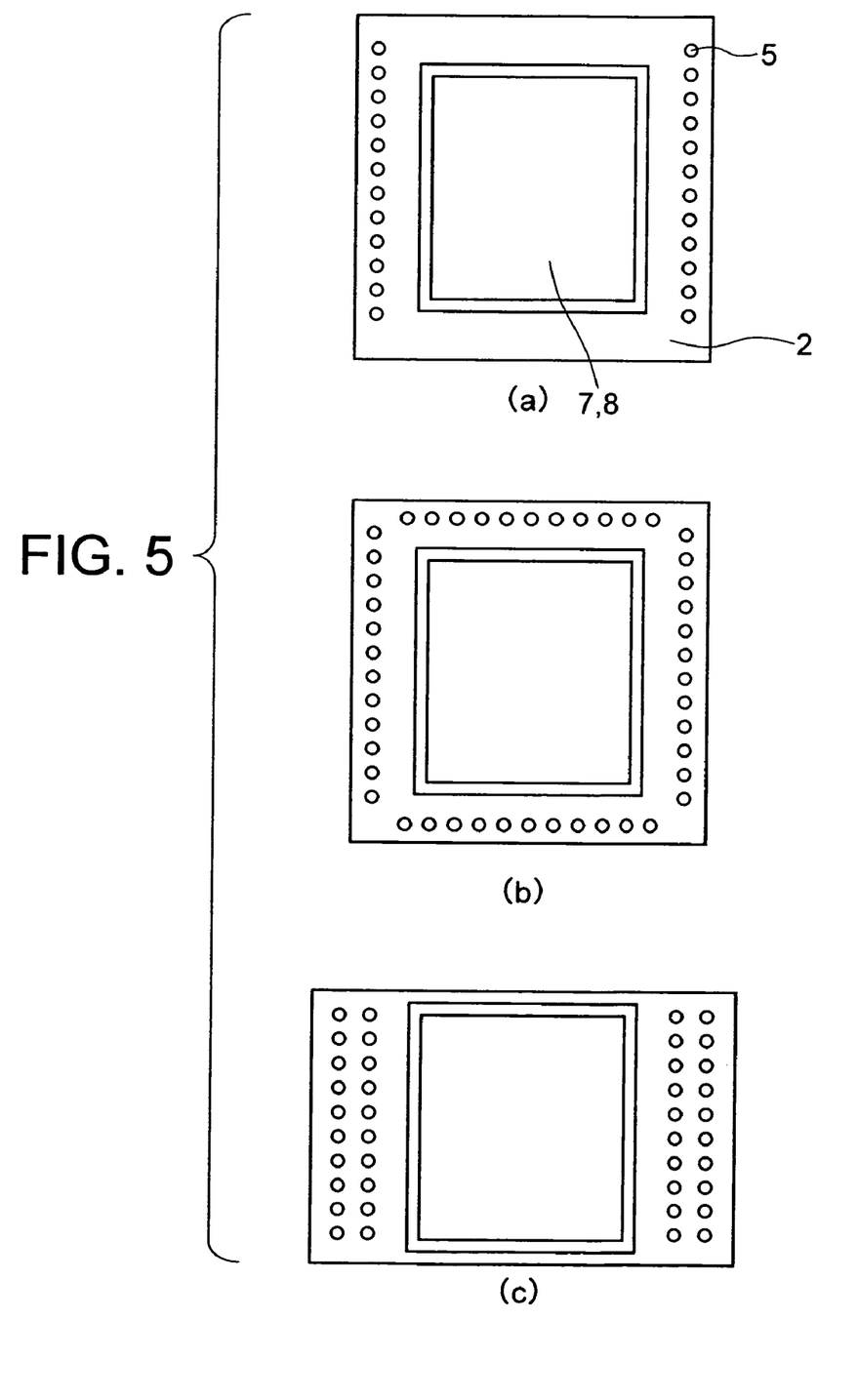
FIG. 5 is views showing a semiconductor package according to the invention.

FIG. 5 is views showing an arrangement of solder balls on a semiconductor package in the first and second embodiments. The number of solder balls is different depending upon a semiconductor element to be mounted. When solder balls as required is small in number, they can be arranged in two rows as shown in FIG. 5(a). Further, when the number of solder balls as required is large and it is difficult to arrange the solder balls in two rows, the solder balls can be arranged in four rows as shown in FIG. 5(b), or in three rows. Further, according to conditions of mounting, solder balls can be arranged right and left in two rows as shown in FIG. 5(c). In a construction as in the invention, in which a semiconductor element and a mount substrate are joined together through a back-surface member, bending deformation of the semiconductor element generated at the time of temperature cycle is small. Further, since warp of a package itself can be decreased, flatness of a package becomes less problematic at the time of mounting and at the time of inspection. Accordingly, solder balls can be arranged freely without taking account of reliability in strength and thermal aspects. In addition, while three typical arrangements of solder balls are shown in the drawings, solder balls can be arranged freely as described above in other manners than the three arrangements as shown. This feature makes it possible to consider the construction to be one, in which a semiconductor package has a high freedom in outside dimension and which is suited to high-density mounting and facilitates wiring on a wiring member and a mount substrate.

Figure 6:
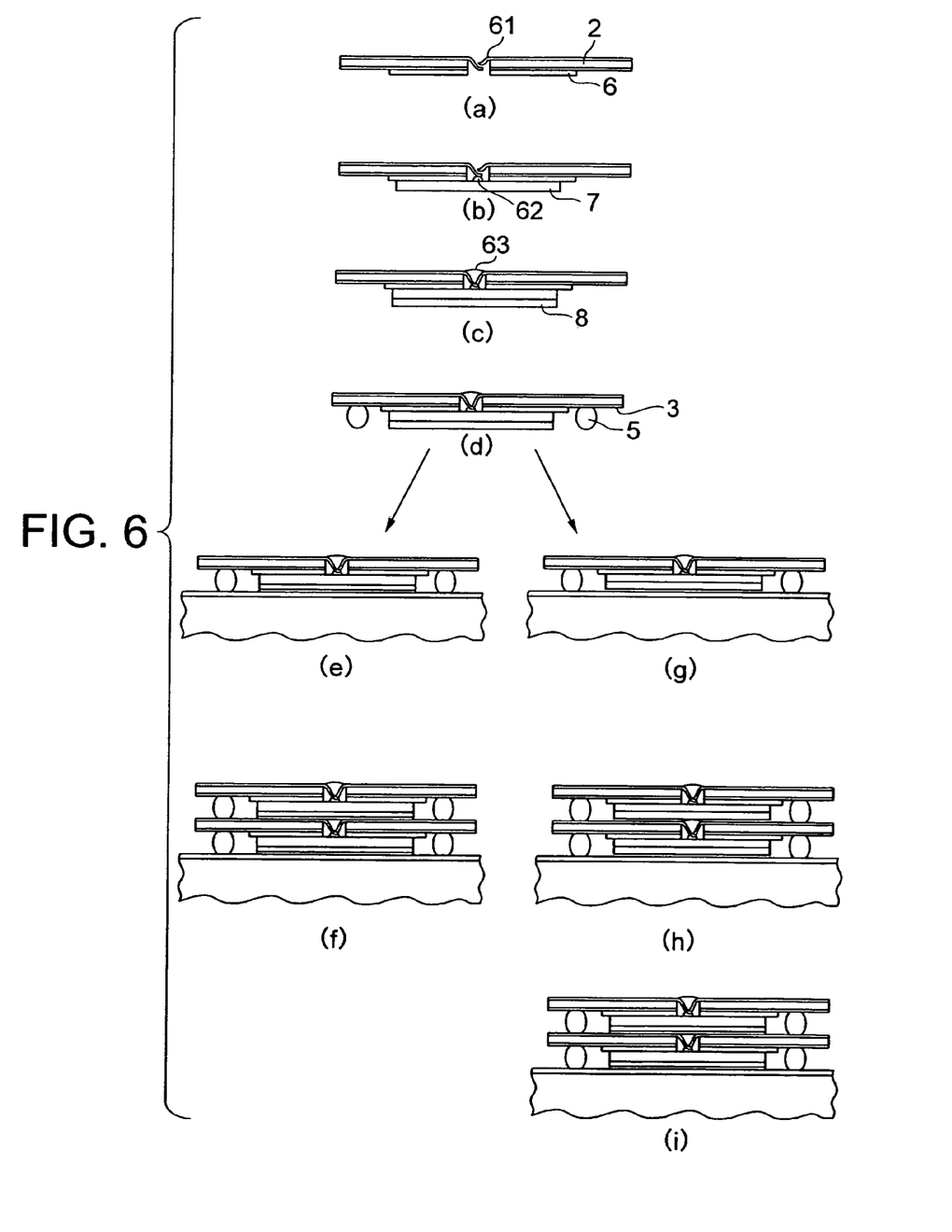
FIG. 6 is views illustrating a method of manufacturing a semiconductor module, according to the invention.

FIG. 6 illustrates a method of manufacturing a semiconductor module according to the first embodiment. First, the method of manufacturing a semiconductor module will be described with reference to FIGS. 6(a) to 6(d). As shown in FIG. 6(a), a binder member 6 is joined to a tape-shaped wiring member in which circuit layers 3, 4 formed by means of etching are arranged on both sides of an insulator 2 and inner leads 61 are provided by removing the insulator 2 in the vicinity of locations to be joined to bumps of a semiconductor element. At this time, the binder member 6 is not provided in the locations to be joined to bumps of the semiconductor element like the insulator 2. In addition, while one package is shown in the drawing, handling at the time of manufacture can be made easy by connecting a plurality of tape-shaped wiring members together.

Subsequently, the semiconductor element 7 is joined to the binder member 6 as shown in FIG. 6(b). At this time, the semiconductor element 7 is arranged in such a manner that its circuit surface is joined to the binder member 6 and bumps 62 of the semiconductor element 7 are positioned below the inner leads 61. Subsequently, bonding is used to join the bumps of the semiconductor element to the wiring layers whereby conduction is built up between the semiconductor element and the wiring layers.

Subsequently, an epoxy base resin 63 is made to flow into a location, in which bonding is achieved, to seal the inner wires 61 and the bumps 62 and an epoxy base resin is coated on a back surface of the semiconductor element to form a back-surface member 8 as shown in FIG. 6(c). According to the embodiment, sealing and formation of the back-surface member can be carried out in a single process by using the same material for a resin for sealing of the inner wires and bumps and for a resin of the back-surface member. Further, coating of the resin is carried out under a temperature condition of the order of 160° C. that corresponds to a curing temperature of the resin. By carrying out sealing of the semiconductor element and the wiring members and formation of the back-surface member in the same process, warp deformation of a package caused by a difference in coefficient of linear expansion between the semiconductor element and the wiring members and warp deformation of the package caused by a difference in coefficient of linear expansion between the semiconductor element and the back-surface member cancel each other when temperature falls to room temperature after the resin coating, so that it is possible to decrease warp of the package in all temperature zones from high temperatures to room temperature.

Finally, a package is finished by joining the solder balls as shown in FIG. 6(d). At this time, paste solder is coated on the wiring layer 3 and the solder balls 5 are arranged in locations, in which the paste solder is coated, whereby the solder balls 5 are put in a state of being adhered to the wiring layer 3 by the viscosity of the paste solder. Thereafter, the solder balls are joined to the semiconductor package by raising temperature of the semiconductor package to the fusing point of the solder or higher and then dropping the temperature to room temperature. In the embodiment, since a lead-free compound of tin, silver, and copper is used for the solder material, temperature is raised to the order of 250° C. exceeding the fusing point thereof. Since warp deformation of the package caused by a difference in coefficient of linear expansion between the semiconductor element and the wiring members and warp deformation of the package caused by a difference in coefficient of linear expansion between the semiconductor element and the back-surface member cancel each other also in the processes of temperature rise and temperature drop, warp of the package is small and any disadvantage is not caused in the processes. Further, in the case where tape-shaped wiring members of a plurality of semiconductor packages are connected together, semiconductor packages are finished by cutting apart the members into respective pieces at this stage.

While the method of manufacturing a semiconductor package that constitute a semiconductor module according to the first embodiment has been described heretofore, it goes without saying that the effect of the invention is produced even by a semiconductor package manufactured in other processes provided that the semiconductor package is constructed to have a feature of the invention. For example, instead of coating an epoxy base resin as a back-surface member, a back-surface member may be formed by sticking a resin sheet for die bonding. In the case where a resin sheet is used as a back-surface member, however, the process of sticking of the sheet becomes necessary while the back-surface member can be made uniform in thickness as compared with the case of resin coating. Further, in the case where a glass epoxy substrate, or a build-up substrate is used as a wiring member in place of a polyimide tape, gold bump joining, etc. in stead of bonding is usable for electric conduction between a semiconductor element and wiring members. In case of using the gold bump joining, reliability in joints can be improved by filling an under-fill material in the joints and the back-surface member can be formed by coating the under-fill material also on a back surface of the semiconductor element.

Electric conduction between the mount substrate and the semiconductor element may be achieved by continuously arranging a package on a side of the mount substrate and a package on a side of a radiation plate, then raising temperature to the fusing point of a solder material or higher and then dropping the temperature to room temperature. In this case, a single heat history applied to a semiconductor module will do.

Subsequently, a method of manufacturing a semiconductor module will be described. A first method of manufacturing a semiconductor module will be described with reference to FIGS. 6(e) and 6(f), and a second method of manufacturing a semiconductor module will be described with reference to FIGS. 6(g) to 6(i).

With the first manufacturing method, as shown in FIG. 6(e), a bonding layer is first provided on a surface of the back-surface member of the semiconductor package on a side of a mount substrate and placed on the mount substrate. Thereafter, electric conduction between the mount substrate and the semiconductor package is achieved by raising temperature to the fusing point of a solder material or higher and then dropping the temperature to room temperature, and the bonding layer provided on the surface of the back-surface member cures, so that the back-surface member and the mount substrate are mechanically joined together. Subsequently, as shown in FIG. 6(f), a bonding layer is provided on a surface of a back-surface member of a semiconductor package on a side of the radiation plate to be disposed on the semiconductor package on the side of the mount substrate, and temperature is raised to the fusing point of the solder material or higher, so that a semiconductor module of laminated construction is formed.

While a plurality of heat histories are applied to the semiconductor module in the course of assembling in the manufacturing process of the semiconductor module, failure such as faulty joining of solder balls, peeling of the bonding layer on the back-surface member, etc. in the course of the processes can be prevented since warp of the respective semiconductor packages is decreased by the back-surface members. Further, two layers, that is, the back-surface member and the bonding layer are formed between the semiconductor element of the semiconductor module and the mount substrate.

Then, the second method of manufacturing a semiconductor module will be described. As shown in FIG. 6(g), a semiconductor package on a side of a mount substrate is first placed on a mount substrate. At this time, unlike the first method of manufacturing a semiconductor module, any bonding layer is not provided on a surface of a back-surface member. Electric conduction between the mount substrate and the semiconductor package is achieved by raising temperature to the fusing point of a solder material or higher and then dropping the temperature to room temperature. Subsequently, as shown in FIG. 6(h), a semiconductor package on a side of a radiation plate is placed on the semiconductor package on a side of the mount substrate and temperature is raised to the fusing point of the solder material or higher, whereby the two semiconductor packages are mounted on the mount substrate. Thereafter, as shown in FIG. 6(i), a semiconductor module is formed by causing an under-fill material of high permeability to flow into a gap between the mount substrate and the back-surface member of the package on the side of the mount substrate and into a gap between the package on the side of the mount substrate and the package on the side of the radiation plate and raising temperature to the curing temperature of the under-fill material or higher.

While various heat histories are generated on the semiconductor module in the course of assembling in the second manufacturing process of a semiconductor module, failure such as faulty joining of solder balls, etc. in the course of the processes can be prevented since warp of the respective semiconductor packages is decreased by the back-surface members. According to the second method of manufacturing a semiconductor module, two layers, that is, the back-surface member and the under-fill material are formed between the semiconductor element of the semiconductor module and the mount substrate.

Electric conduction between a mount substrate and a semiconductor element may be achieved by continuously arranging the package on the side of the mount substrate and the package on the side of the radiation plate, then raising temperature to the fusing point of a solder material or higher and then dropping the temperature to room temperature. In this case, a single heat history applied to a semiconductor module will do.

As compared with the second method of manufacturing a semiconductor module, the curing process of an under-fill material can be omitted in the first method of manufacturing a semiconductor module. On the other hand, according to the second method of manufacturing a semiconductor module, offset of a position, in which a package is mounted, can be automatically corrected by surface tension of the solder because a back-surface member and a mount substrate are not bonded to each other at the time of joining of the solder balls. Further, the use of a thermoplastic adhesive in the first manufacturing method and the use of a repairable under-fill material in the second manufacturing method make it possible to remove a semiconductor package from a mount substrate and replace the semiconductor package by a new one after a semiconductor module is manufactured.

It should be noted that the present processes exemplify one manufacturing method among various conceivable embodiments of the invention, and it goes without saying that the effect of the invention is produced even by a semiconductor package manufactured in other processes provided that the semiconductor package is constructed to have a feature of the invention.

Figure 7:
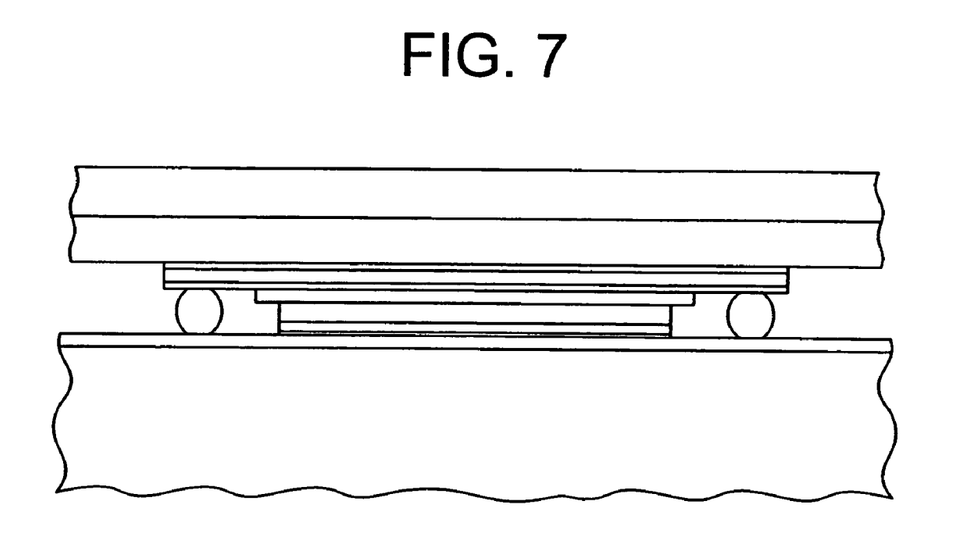
FIG. 7 is a view showing a fourth embodiment of the invention.

FIG. 7 is a schematic view showing a cross section of a semiconductor module according to a fourth embodiment. According to the embodiment, not stacking of semiconductor packages but mounting of a single package is performed on one side of a mount substrate. In the embodiment, the number of semiconductor packages mounted on the mount substrate is reduced but a semiconductor module is decreased in thickness, so that it can be installed in a smaller space than a semiconductor module that involves stacking and mounting. Conversely, a semiconductor module that is allowed to be installed in a large space and demanded of a large capacity can be constructed to afford stacking of mount substrates in three or more stages within a range, in which a dimensional increase in a thicknesswise direction is allowable.

Figure 8:
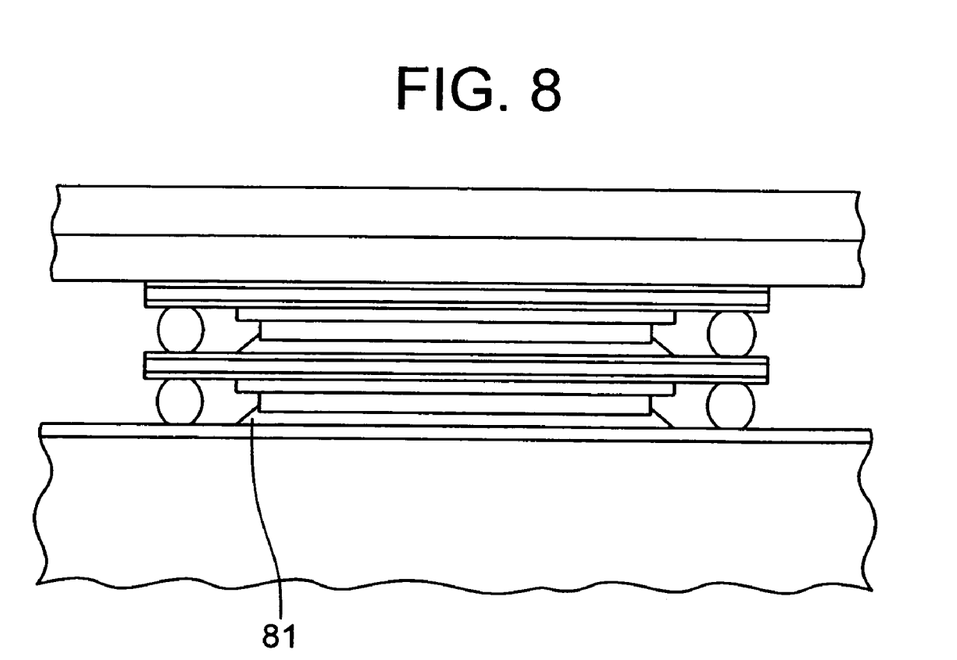
FIG. 8 is a view showing a fifth embodiment of the invention.

FIG. 8 is a schematic view showing a cross section of a semiconductor module according to a fifth embodiment. According to the embodiment, any back-surface member is not provided on a back surface of a semiconductor element but the semiconductor element is joined directly to a mount substrate by means of a resin 81. In addition, an under-fill agent is used for joining of the semiconductor element and the mount substrate. While the effect of decreasing warp deformation of a semiconductor package itself is not produced because any back-surface member is not provided, bending deformation of a semiconductor element after mounting of the semiconductor package can be decreased in the same manner as in other embodiments, so that there is produced an effect in extension of the life-time of solder and prevention of chip cracking. Further, since heat generated from the semiconductor element is transferred to the mount substrate and a radiation plate through the resin 81, the ability of heat radiation is also improved as compared with the case where the resin 81 is not provided. That is, the embodiment is one that extends the life-time of solder, prevents chip cracking, and improves the ability of heat radiation in the problems being solved by the invention. In addition, when not only the semiconductor elements but also the solder balls 5 are covered by an under-fill agent in the embodiment, the life-time of solder is further extended.

Figure 9:
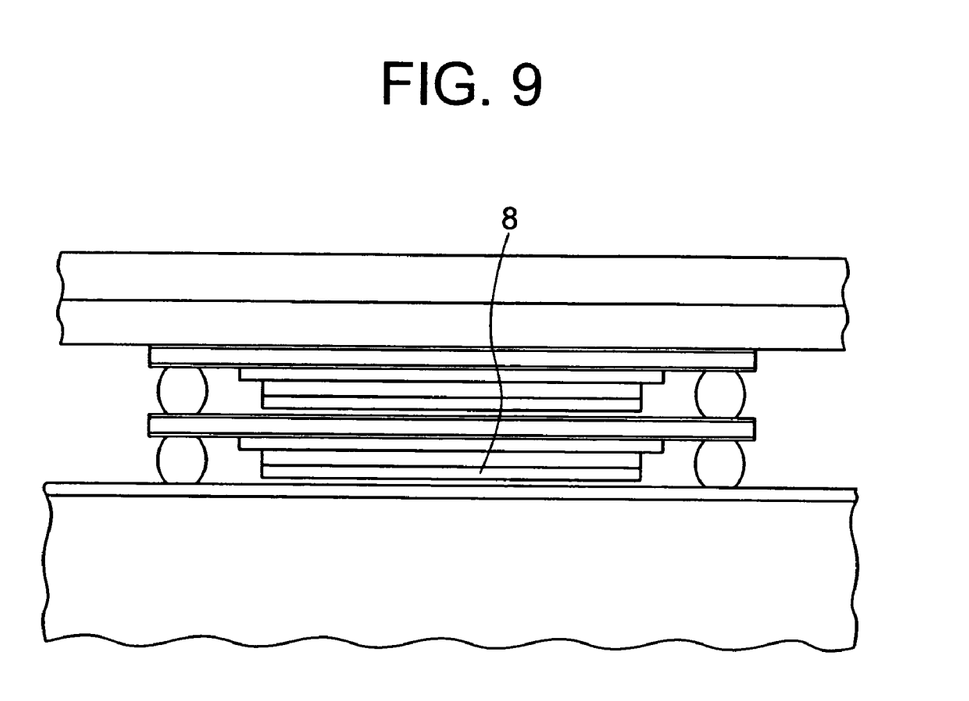
FIG. 9 is a view showing a sixth embodiment of the invention.

FIG. 9 is a schematic view showing a cross section of a semiconductor module according to a sixth embodiment. The embodiment is different from the first embodiment in that a back-surface member on a semiconductor back surface is not joined to a mount substrate. According to the embodiment, a semiconductor package itself is the same in construction as that in the first embodiment and the effect of decreasing warp deformation of a semiconductor package is produced. Since bending deformation of a semiconductor element after mounting is sustained only by solder balls, however, the effect in extension of the life-time of solder and prevention of chip cracking is small. Further, since heat generated from the semiconductor element is transferred to the mount substrate and a radiation plate through the medium of an air layer, the ability of heat radiation is degraded as compared with the construction, which is free from the medium of an air layer as in the first embodiment. However, as compared with the construction provided with no back-surface member, a thickness of the air layer is deducted by a thickness of the back-surface member, so that the ability of heat radiation is improved. That is, the embodiment is one, in which the problems being solved by the invention are solved with respect to decreasing warp of a semiconductor package and improving the ability of heat radiation.

Figure 10:
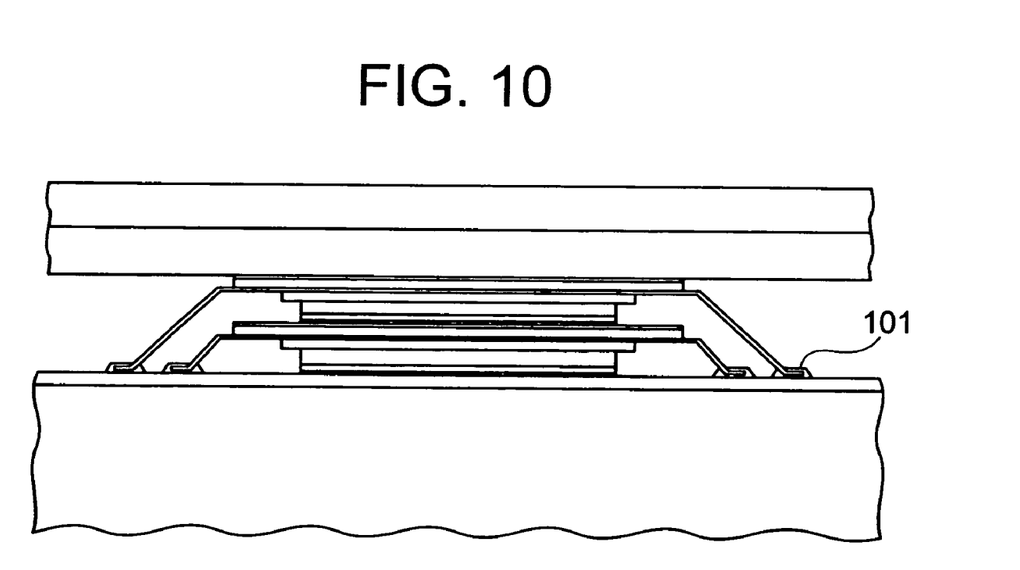
FIG. 10 is a view showing a seventh embodiment of the invention.

FIG. 10 is a schematic view showing a cross section of a semiconductor module according to a seventh embodiment. According to the embodiment, leads are used to achieve electric conduction between a semiconductor package and a mount substrate. The leads are joined to the mount substrate by solder. According to the embodiment, the semiconductor element is joined to the mount substrate by a back-surface member and strain generated at solder joints of the leads and the mount substrate by a thermal load in temperature cycle, etc. is decreased. Further, since a difference in thermal deformation between the semiconductor element and the mount substrate due to a difference therebetween in coefficient of linear expansion is accommodated by deformation of the leads themselves, strain at the solder joints becomes small to enable ensuring the life-time of solder. Further, since the member is provided on a back surface of the semiconductor element, the effect in decreasing warp of the semiconductor package, preventing cracking of the semiconductor element, and improving the ability of heat radiation is also produced. That is, the embodiment is one, in which the problems being solved by the invention are solved with respect to decreasing warp of a semiconductor package, extending the life-time of solder, and improving the ability of heat radiation.

Figure 11:
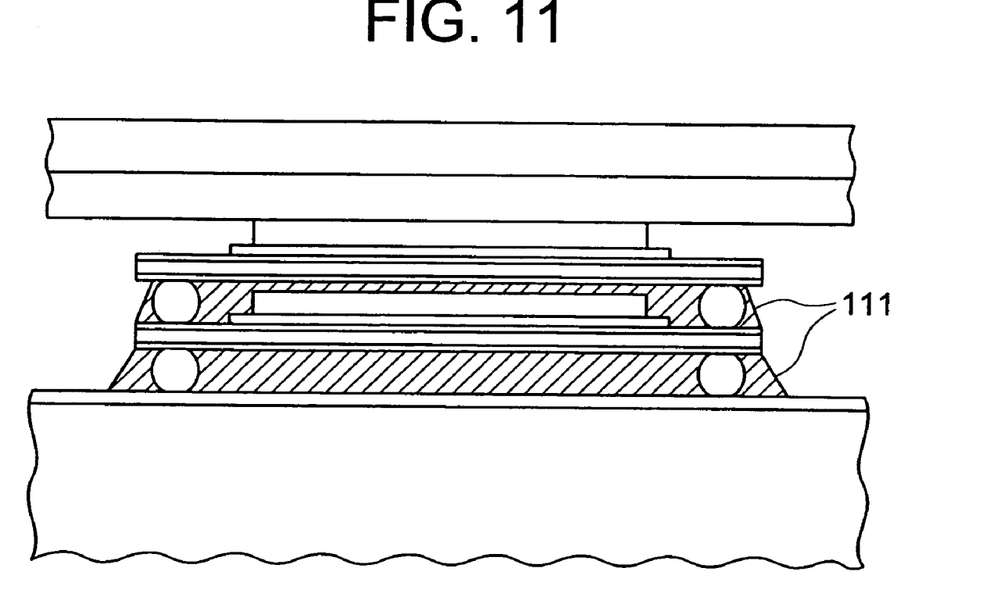
FIG. 11 is a view showing an eighth embodiment of the invention.

FIG. 11 is a schematic view showing a cross section of a semiconductor module according to an eighth embodiment. According to the embodiment, any back-surface member 10 is not provided on a back surface of a semiconductor element as is in the fifth embodiment. The embodiment is different from the fifth embodiment in that semiconductor elements of respective packages are arranged above wiring layers 3, 4. Also, an under-fill material 111 is filled in a gap between a package 11 on a side of a mount substrate and the mount substrate 1 and in a gap between a package on a side of a radiation plate and the package on the side of the mount substrate. According to the embodiment, while a thickness of the semiconductor module is increased by a thickness of semiconductor elements as compared with that in the other embodiments, a large gap is ensured between the package 11 on the side of the mount substrate and the mount substrate 1, so that the under-fill material becomes easy to fill and so has an advantage of further protection of that solder for joining of the package on the side of the mount substrate and the mount substrate, the life-time of which is an important problem. Since the under-fill material becomes easy to fill, a material such as resin, etc., which is poor in filling property but inexpensive, can be used for the under-fill material.

Figure 12:
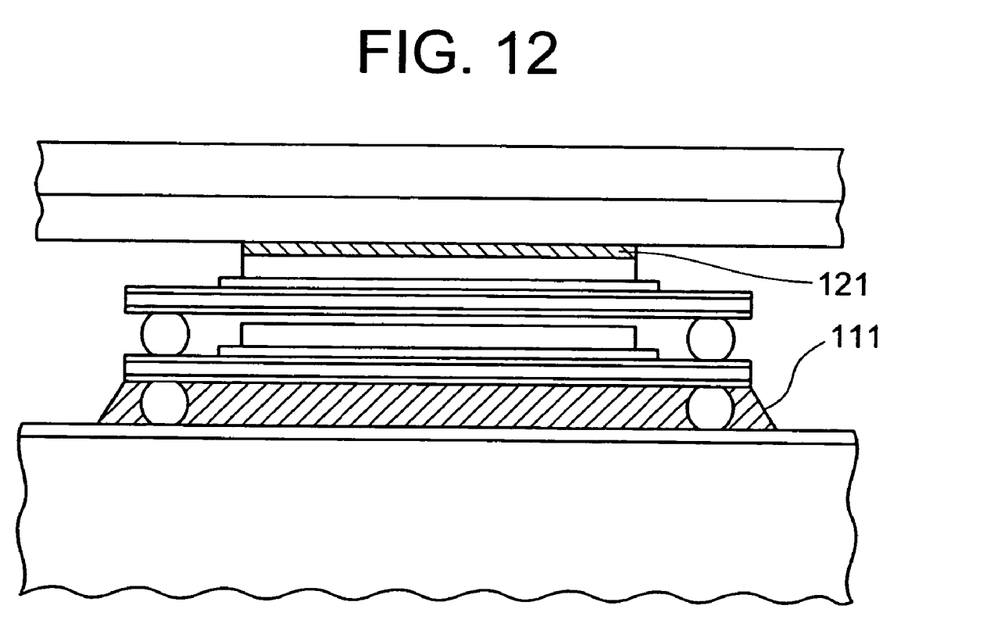
FIG. 12 is a view showing a ninth embodiment of the invention.

FIG. 12 is a schematic view showing a cross section of a semiconductor module according to a ninth embodiment. According to the embodiment, semiconductor elements of respective packages are arranged above wiring layers 3, 4 as is in the eighth embodiment. The embodiment is different from the eighth embodiment in that any under-fill material is not filled in a gap between a package on a side of a radiation plate and a package on a side of a mount substrate, and a semiconductor element on the side of the radiation plate and the radiation plate are joined through a binder member 121. By joining the radiation plate and the semiconductor element together to restrain warp deformation of the semiconductor element on the side of the radiation plate, reliability of that solder, which joins the semiconductor element on the side of the radiation plate and the package on the side of the mount substrate together, can be ensured without filling any under-fill material in a gap, which is spatially small between the semiconductor element on the side of the radiation plate and the package on the side of the mount substrate. In addition, reliability of the solder can be further improved by filling an under-fill material in the gap between the semiconductor element on the side of the radiation plate and the package on the side of the mount substrate in addition to arrangement of the binder member 121.

Also, while the radiation plate 10 and the heat conduction member 9 are provided in the embodiments described hereinbefore with reference to the drawings, it is possible not to provide the heat conduction member and not to provide both the radiation plate and the heat conduction member, in the case where semiconductor elements have a small calorific value and temperature rise of the semiconductor elements causes no problem and in the case where semiconductor modules are used in an environment suited to cooling. In this case, semiconductor modules can be made thinner than ones provided with a radiation plate.

While the embodiments have been described, the invention is not limited thereto but it is apparent to those skilled in the art that the invention can be variously modified and corrected within the spirit of the invention and the scope of the appended claims.

According to the invention, it is possible to provide a mounted module that can effectively restrict portions, in which stress concentration is generated, in the module and is excellent in heat radiation while ensuring reliability in mounted portions.

The invention claimed is:

1. A semiconductor module comprising:
a first semiconductor package and a second semiconductor package each comprising a semiconductor element, a wiring substrate having a wiring member connected to the semiconductor element and external terminals connected to the wiring member, and a back-surface member formed on a side of the semiconductor element opposed to another side of the semiconductor element toward the wiring substrate; and
a mount substrate, on which the first semiconductor package is mounted;
wherein the second semiconductor package is stacked on the first semiconductor package,
wherein a first bonding layer is provided between the wiring substrate of the first semiconductor package and the back-surface member of the second semiconductor package, and
wherein each back-surface member is formed of a material selected based upon a coefficient of linear expansion and a modulus of longitudinal elasticity of the material in order to minimize bending deformation and warp of the semiconductor elements,
wherein a second bonding layer is provided between the back-surface member of the first semiconductor substrate and the mount substrate, and
wherein each back-surface member is arranged on at least portions including corners of the back surface of an associated semiconductor element.

2. A semiconductor module comprising:
a first semiconductor package comprising a semiconductor element, a wiring substrate having a wiring member connected to a semiconductor element and external terminals connected to the wiring member, and a back-surface member formed on a side of the semiconductor element opposed to another side of the semiconductor element toward the wiring substrate; and
a mount substrate, on which the first semiconductor package is mounted;
wherein a bonding layer is provided between the back-surface member of the first semiconductor package and the mount substrate,
wherein the back-surface member is formed of a material selected based upon a coefficient of linear expansion and a modulus of longitudinal elasticity of the material in order to minimize bending deformation and warp of the semiconductor element, and
wherein the back-surface member is arranged on at least portions including corners of the back surface of the semiconductor element.

3. A semiconductor module according to claim 1 or 2, wherein the semiconductor element of the first semiconductor package is mounted on the wiring substrate of the first semiconductor package on the same side as that, on which a connection member to be connected to the external terminals is mounted.

4. A semiconductor module according to claim 1 or 2, wherein the wiring substrate comprises two wiring layers on both sides thereof.

5. A semiconductor module according to claim 1 or 2, wherein the bonding layer comprises an epoxy resin.

6. A semiconductor module according to claim 1, wherein the external terminals are connected to a solder member, and the solder member connecting between the first semiconductor package and the second semiconductor package has a larger length than a thickness of the semiconductor element.

* * * * *